United States Patent
Li

[19]

[11] Patent Number: 6,042,645
[45] Date of Patent: Mar. 28, 2000

[54] METHOD FOR INDEPENDENTLY SUPPORTING THE PULL HEAD OF A CZOCHRALSKI CRYSTAL GROWING SYSTEM

[75] Inventor: Zhixin Li, Hudson, N.H.

[73] Assignee: General Signal Technology Corporation, Stamford, Conn.

[21] Appl. No.: 09/177,269

[22] Filed: Oct. 22, 1998

Related U.S. Application Data

[62] Division of application No. 08/786,878, Jan. 23, 1997, Pat. No. 5,879,452.
[60] Provisional application No. 60/010,575, Jan. 25, 1976.

[51] Int. Cl.[7] ................................................. C30B 35/00
[52] U.S. Cl. .................................................................. 117/13
[58] Field of Search ..................................... 117/216, 218, 117/221, 900, 911

[56] References Cited

U.S. PATENT DOCUMENTS

| | | | |
|---|---|---|---|
| 5,254,316 | 10/1993 | Oda et al. | 117/208 |
| 5,762,703 | 6/1998 | Schulmann et al. | 117/13 |
| 5,846,322 | 12/1998 | Schulmann et al. | 117/216 |

*Primary Examiner*—Felisa Hiteshew
*Attorney, Agent, or Firm*—Kudirka & Jobse, LLP

[57] ABSTRACT

A method for mounting the pull head of a CZ crystal puller includes the steps of mounting the pull head on a frame which is supported independently from the crystal puller receiving chamber. In particular, the pull head is mounted on a rigid frame which is supported by the same surface that supports the melt charge crucible. The pull head is then aligned relative to the rigid frame, rather than to the receiving chamber, and can be accurately aligned with the crucible rotation axis and positioned in order to insure that its rotation axis is vertical. In one embodiment, the method includes the step of mounting the pull head on a plate which engages alignment pins attached to the rigid frame. The alignment pins insure proper alignment of the pull head relative to the frame. When the receiving chamber is raised to allow the crystal to be removed, the plate is engaged by the receiving chamber and lifted off the alignment pins so that the pull head moves with the receiving chamber. When the receiving chamber is moved back into its ingot-growing position and lowered, the alignment pins reengage the plate to realign the pull head. In this embodiment, the method includes the step of connecting the pull head to the receiving chamber by a flexible bellows so that the pull head remains vacuum sealed to the receiving chamber when the chamber is lowered and the alignment pins are engaged.

17 Claims, 5 Drawing Sheets

6,042,645

METHOD FOR INDEPENDENTLY SUPPORTING THE PULL HEAD OF A CZOCHRALSKI CRYSTAL GROWING SYSTEM

RELATED APPLICATION

This application is a division of Ser. No. 08/786,878, Filed Jan. 23, 1997 U.S. Pat. No. 5,879,452, which was based on a provisional U.S. patent application entitled CZOCHRALSKI CRYSTAL PULLER WITH INDEPENDENTLY SUPPORTED PULL HEAD SYSTEMS, filed Jan. 25, 1996 by Zhixin Li and assigned Ser. No. 60/010,575.

FIELD OF THE INVENTION

This invention relates to crystal growing systems and, more particularly, to a method of, and apparatus for, pulling a seed and ingot from a melt.

BACKGROUND OF THE INVENTION

Several techniques are known in the art for growing crystals. The Czochralski (CZ) process is the most widely used technique for growing crystal ingots used in the manufacture of integrated circuit (IC) chips. In the CZ process, a crystal puller system grows solid, single crystal ingots from melted charge material. High-quality ingots are substantially free of defects, have a uniformity of characteristics throughout the ingot, and are largely uniform from one ingot to the next.

A modern CZ crystal puller typically includes a crucible which holds a liquid melt form of a charge material, such as silicon from which the crystal is to be grown. The crucible is surrounded by a furnace that heats the charge to a melted state (the "melt"). The crucible and furnace are located in a sealed vacuum chamber which includes the components: a growth chamber that surrounds the furnace, a transition chamber located above the growth chamber and an elongated receiving chamber which holds the crystal as it grows. The vacuum chamber allows the environment around the growing crystal to be controlled. A vacuum slide valve located between the receiving chamber and the transition chamber can be used to isolate the two chambers. The vacuum chamber components typically are bolted together with vacuum seals between the pieces.

During the pulling process, a pull head mounted on the top of the receiving chamber holds a "seed" crystal at the end of a vertical rod or a cable and lowers the seed to contact the melt. Upon contacting the melt, the seed causes a local decrease in melt temperature, which causes a portion of the melt to crystallize around the seed. The seed is then slowly withdrawn from the melt, passed through the transition chamber and passed into the receiving chamber by the pull head. As the seed is withdrawn, the portion of the newly-formed crystal that remains within the melt essentially acts as an extension of the seed and causes more melt to crystallize around the seed. This above process is continued until the crystal is grown to the desired size, e.g., eight to ten feet long and weighing about 150 Kg. Eventually, the finished crystal is lifted entirely into the receiving chamber, which is then detached from the remaining portion of the vacuum chamber system so that the crystal may be retrieved.

To lift the seed and eventually the ingot, a typical pull head includes a controllable winch having a cable affixed to the seed and the attached ingot. Conventionally, the pull head is attached directly to the top of the receiving chamber, so that, as the receiving chamber is moved or detached, the pull head moves With it. To improve an ingot's uniformity, in many systems, the pull head is mounted on a plate that is rotatable with respect to a base which is, in turn, is mounted on the receiving chamber. The rotatable plate allows the pull head to rotate around a vertical longitudinal axis of the crystal during the pulling operation so that the pulling cable, the seed crystal and the ingot rotate around the crystal longitudinal axis as the ingot is withdrawn from the melt. In addition, to further improve uniformity, the crucible containing the melt is often rotated about a vertical axis parallel to the same crystal longitudinal axis as well.

To insure uniform crystal growth, the pull head must be carefully aligned relative to the crucible so that the axis of rotation of the cable system aligns with the axis of rotation of the crucible. Further, the pull head itself must be positioned so that its rotational axis is vertical. However, the position of the receiving chamber relative to the rotational axis of the crucible is dependent on the tolerance stack-up of the base chamber, grow chamber, transition, isolation valve and receiving chamber. This structure renders it difficult to achieve an accurate alignment. Furthermore, the receiving chamber must be removed from the vacuum chamber structure and then replaced during each crystal pulling process. Each time the receiving chamber is replaced, it may not be returned to its exact previous position due to the tolerances in the chamber pieces. Consequently, it is difficult to exactly align the pulling cable to the pulling head axis and the crucible rotational axis. Further, the pulling head may become tilted so that the rotational axis of the pulling head varies from true vertical.

It has been found that this misalignment among the pulling cable, the pulling head axis, and the crucible rotational axis, as well a tilting of the pulling head, will deteriorate the growing condition of the crystal and render the rotating pulling cable/crystal susceptible to an orbiting motion which may be very harmful to the crystal quality and may even disrupt the crystal growing process.

Consequently, there is a need in the art for improved methods and apparatus for growing crystal ingots that provide stable, repeatable growth of crystal ingots.

It is an object of the invention to provide an improved method of, and apparatus for, pulling a crystal ingot from a melt.

It is another object to increase the stability of the crystal growing process, primarily by improving the ability to align the pulling cable and improving the repeatability of the alignment.

SUMMARY OF THE INVENTION

In accordance with the inventive method, the pull head of a CZ crystal puller is mounted on a frame which is supported independently from the receiving chamber. In particular, the pull head is mounted on a rigid frame which is supported by the same surface that supports the crucible. The pull head is then aligned relative to the rigid frame, rather than to the receiving chamber, and can be accurately aligned with the crucible rotation axis and positioned in order to insure that its rotation axis is vertical.

In one embodiment, the method includes the step of mounting the pull head on a plate which engages alignment pins attached to the rigid frame. The alignment pins insure proper alignment of the pull head relative to the frame. When the receiving chamber is raised to allow the crystal to be removed, the plate is engaged by the receiving chamber and is lifted off the alignment pins so that the pull head moves with the receiving chamber. When the receiving chamber is returned to its ingot-growing position and lowered, the alignment pins reengage the plate to realign the pull head on the frame. In this embodiment, an additional step includes connecting the pull head to the receiving chamber by a flexible bellows so that the pull head remains vacuum sealed to the receiving chamber when the chamber is lowered and the alignment pins are engaged.

DESCRIPTION OF PREFERRED EMBODIMENTS

Figure 1:
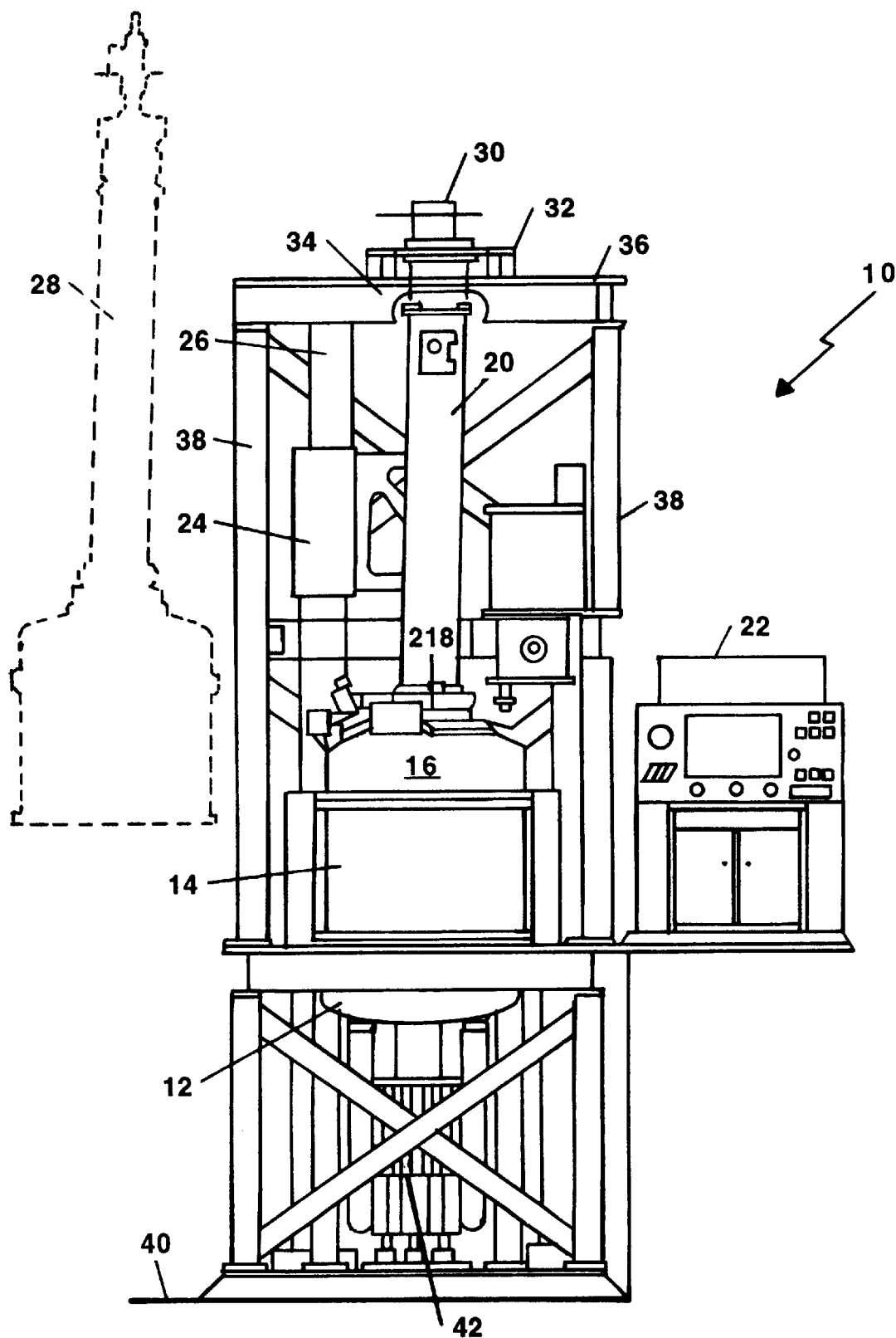
FIG. 1 is an elevation view of a CZ crystal puller system, including a preferred embodiment of the invention.
Figure 2:
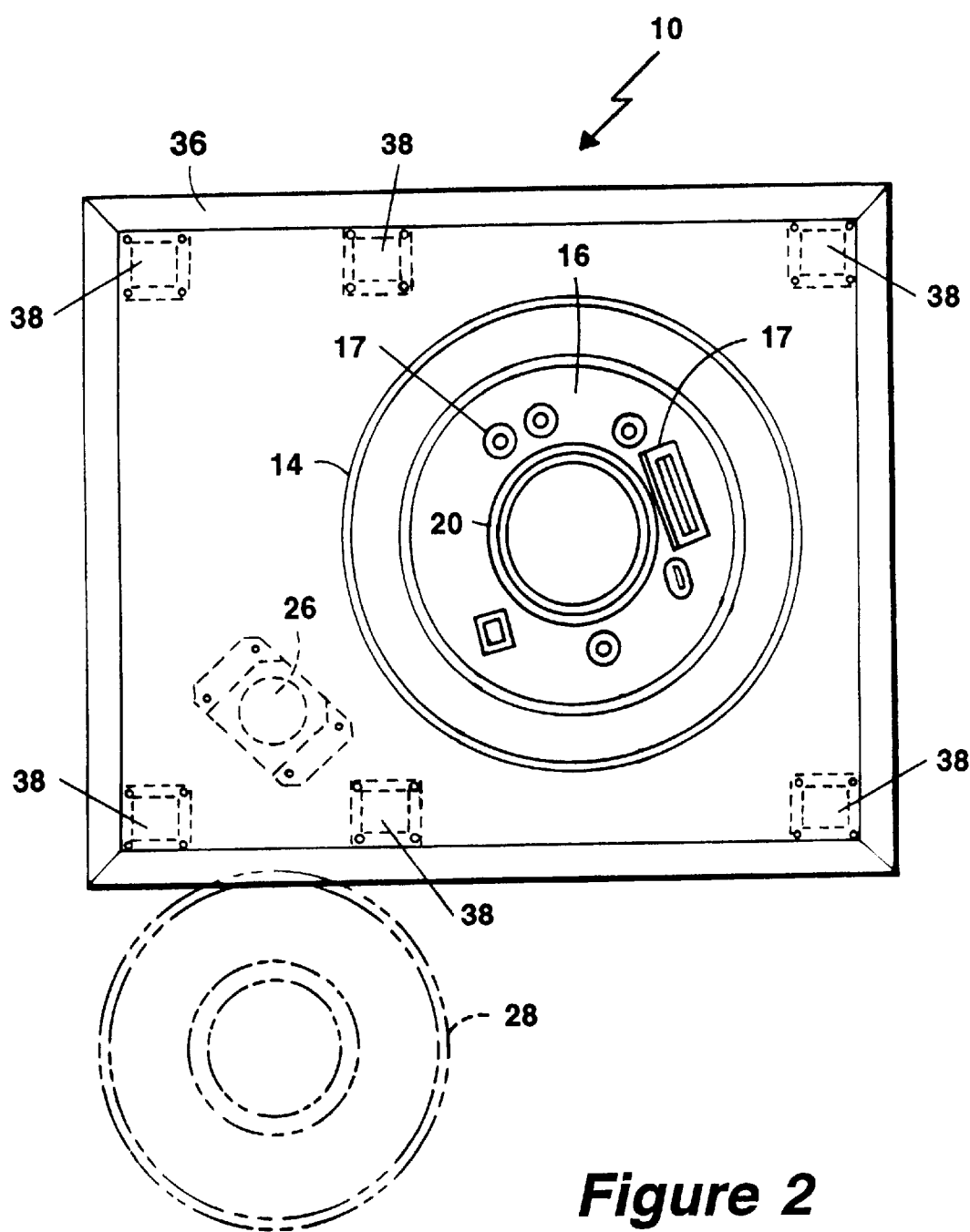
FIG. 2 is a plan view of the CZ crystal puller illustrated in FIG. 1.

Referring to FIGS. 1 and 2, the basic puller system 10 includes base chamber 12, growth chamber 14, transition chamber 16, isolation valve 18 and receiving chamber 20. The base chamber 12 encloses a mechanism which supports a crucible and raises it as the crystal is withdrawn therefrom in order to maintain the melt level in the crucible constant with respect to the remainder of the system 10. The growth chamber 14 encloses the crucible and a furnace surrounding the crucible for melting the charge material in the crucible. The transition chamber 16 includes a number of viewing and instrumentation ports 17 in its upper surface which allow the crystal pulling process to be monitored by an operator. The receiving chamber 20 receives the grown crystal ingot (not shown), carried by a cable or rod (not shown), in a manner similar to that described above.

A control system 22 monitors various growth parameters, such as the melt-level, and controls various aspects of the system, such as the rate at which a seed is withdrawn from the melt. Lift 24, attached to the receiving chamber 20, slides along pole 26 under the control of the control system 22 and may be used to lift and rotate the combination 28 of growth chamber 14, transition chamber 16 and receiving chamber 20 about the longitudinal axis of pole 26, to move the combination 28 away from the base chamber 12. By operating in this fashion, the system may be cleaned. Alternatively only the combination of the transition chamber 16 and the receiving chamber 20 on the receiving chamber 20 alone can be moved by lift 24 so that the ingot therein may be retrieved from the system 10.

Figure 3:
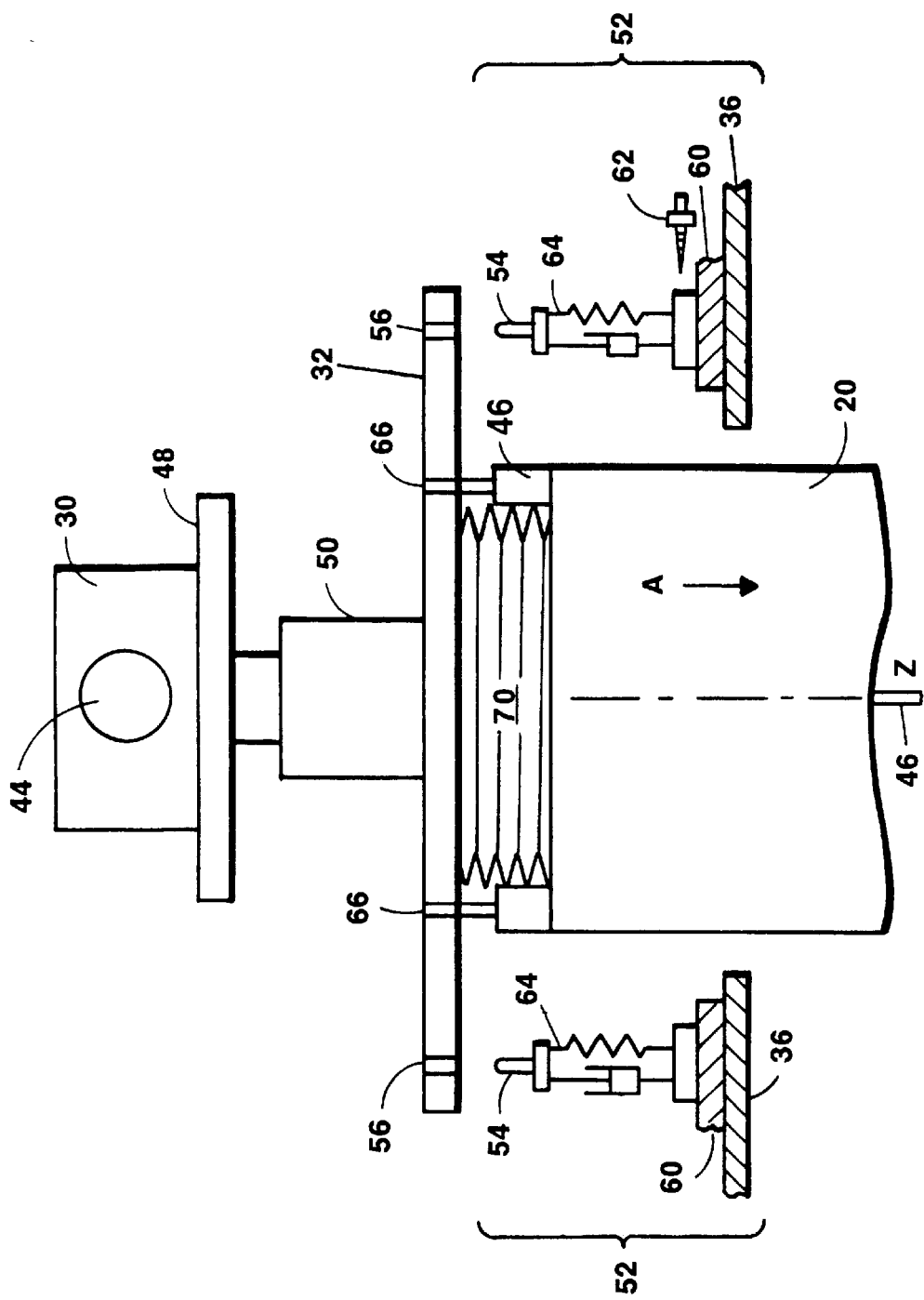
FIG. 3 is a side view of a pull head decoupled from the independent alignment system of this invention.
Figure 4:
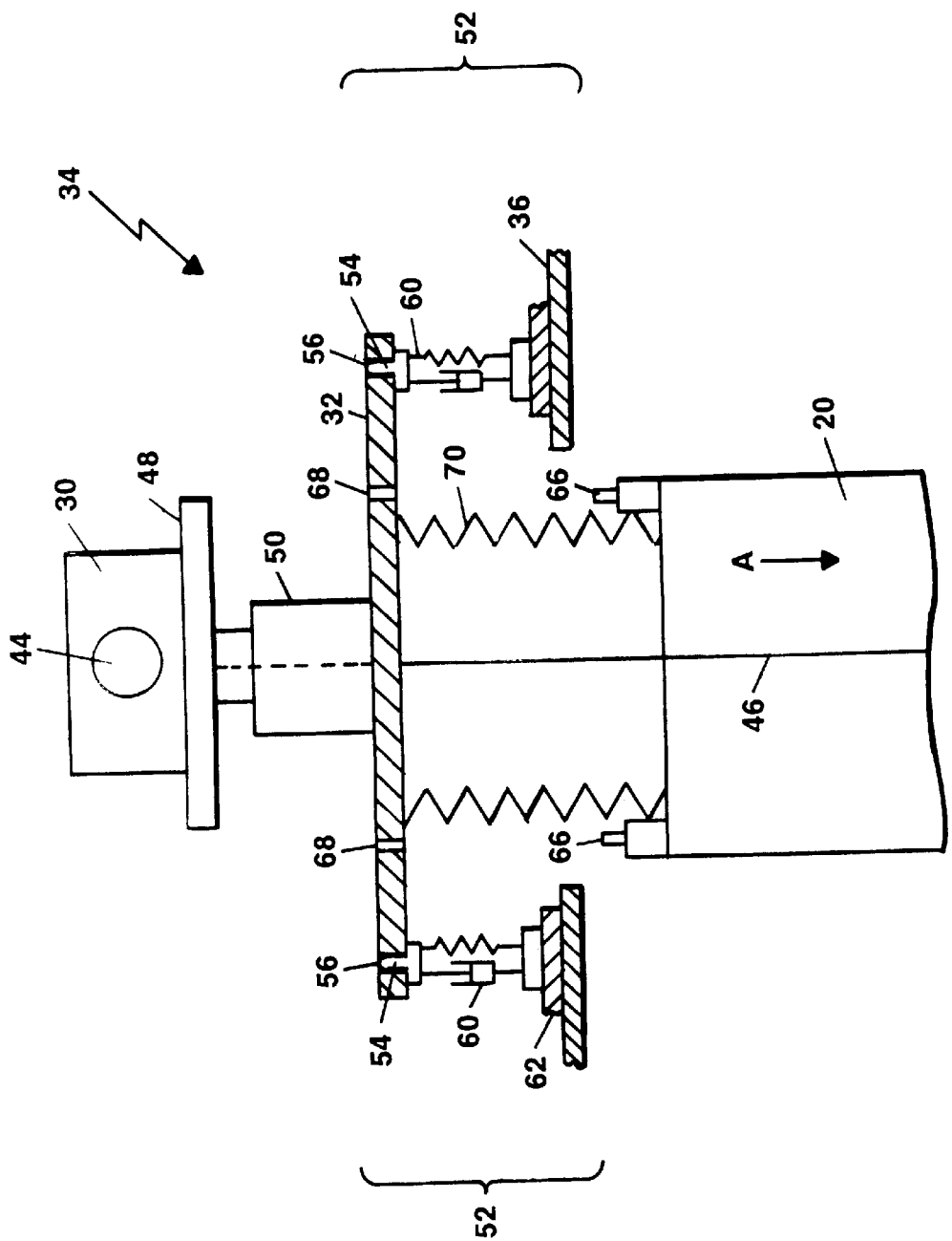
FIG. 4 is a side view of the pull head mounted using an independent alignment system of FIG. 3 with the CZ receiving chamber lowered in the crystal growing position.

FIGS. 3 and 4 are more detailed, enlarged views of the pull head 30 in relation to the support beam 36. Unlike conventional crystal puller systems, the pull head 30 of system 10 (not shown in FIG. 2) is coupled to an independent support and alignment structure rather than being directly mounted on the receiving chamber 20. More particularly, the pull head 30 is coupled to plate 32, which, in turn, is positioned with the aid of alignment structure 34 on a rigid support structure consisting of support beam 36 supported by a framing structure 38. Structure 38 illustratively rests on the same supporting surface 40 as the crucible lift and rotate mechanism 42 so that there is no relative motion between the two structures. FIG. 3 shown the alignment mechanism 52 decoupled from the plate 32 which illustrates the position of the pull head 30 when the receiving chamber is being moved relating to the transition chamber 6. Pull head 30 includes a conventional winch motor 44, which lifts the pulling cable 46 within receiving chamber 20 under the control of the control system 22 (FIG. 1) in order to rotate the crystal within receiving chamber 20. The pull head 30 is mounted on rotatable plate 48, which may rotate under the control of the control system 22. The rotatable plate 48, in turn, is coupled to plate 32 by a ferrofluidic seal 50 through which the cable 46 passes.

FIG. 4 shows the receiving chamber 20 located in the lowered position for crystal growth while the alignment mechanism 52 is coupled to plate 32. In this position, the pull head 30 is effectively coupled to the supporting beam 36 by means of the support structures 52. A tapered alignment pin 54 is provided on the top of each of support structures 52, which may illustratively be conical in shape, engage holes 56 in plate 32. Holes 56 are shaped to match the outer contour of pins 54 (for example, holes 56 may have a conical shape) in order to provide a positive and repeatable alignment of the plate 32 on support structures 52. For example, three support structures 52 with alignment pins 54 can be used arranged in a triangular pattern around the centerline of pull head 30. Alternatively, four support structures with alignment pins can be used. When plate 32 is resting on alignment pins 54, the alignment of pull head 30 is independent of the position of receiving chamber 20 and, instead, depends on the position of stationary support beam 36.

To align the plate 32, and thus the pull head 30 with the rotation axis of crucible 12 (FIG. 1) and to insure that the rotation axis of pull head 30 is vertical, each support structure 52 is mounted on a conventional XYZ table, such as table 60. The XYZ table 60, in turn, is mounted on support beam 36. The XYZ table thus allows the support structures 52, which rest on it, to be aligned in the X, Y, and Z directions relative to the support beam 36 by means of adjustment screws, such as screw 62, in a conventional fashion. Prior to crystal growth, the XYZ table 60 is carefully adjusted to render the pull head axis of rotation colinear with the crucible rotation axis and to render the pull head axis of rotation vertical. Once this adjustment is performed, it does not need to be changed since this alignment is relative to stationary support beam 36 which is rigidly supported by the frame 38, rather than being dependent upon tolerances built up in the vacuum chamber pieces. Because this alignment is independent of the receiving chamber's tolerances, among others, the alignment structures 52 provide a stable, constant alignment from one ingot growing cycle to the next cycle. Moreover, because the alignment of the plate 32 relative to support beam 36 is not expected to change from one ingot growing cycle to the next cycle, the alignment structure 52 is believed to provide more repeatability to the growing process, as the alignment of the cable 46 relative to crucible 12 (FIG. 1) will not change from one growing cycle to the next cycle.

The puller head 30 in FIG. 3 is decoupled from the independent alignment structure 52. The puller head 30 and plate 32 are coupled to receiving chamber 20 with pins 66 which are positioned within holes 68. Plate 32 can move orthogonally relative to the axis of the cable since bellows 70 is compressible. In addition to being sufficiently flexible to allow orthogonal movement of the plate 32, bellows 70 provides a means for maintaining a vacuum seal within the receiving chamber 20. Alignment structure 52 includes tapered locating ends 54 to engage holes 56 in plate 32. Pins 54 are mounted on rigid frame 36 by vibration dampeners 64. Locating pins 54 are adjustable by adjusting XYZ table 60 to align the puller head 30 relative to rigid independent structure 36.

When the receiving chamber 20 is detached from the transition chamber 18 and repositioned by the lift 24, the puller head 30 is lifted from independent support structure 38 and moved with the receiving chamber 20. Thereafter, when the receiving chamber is returned to a position to initiate growth crystal, the puller head 30 is aligned by utilizing the alignment mechanism 52 in conjunction with the support structure 36. When the receiving chamber 20 is lowered in the direction of arrow A, holes 56 and locating pins 54 engage each other while pins 66 and hole 68 eventually disengage from each other.

The support structures 52 may be rigid rods, but preferably, the structures are conventional vibration damper devices 64. Vibration dampers which are suitable for use with the present invention are model 6-DOF vibration dampers manufactured and sold by Minus K Technology, located in 420 S. Hindry Ave., Inglewood, Calif. 90301.

Figure 5:
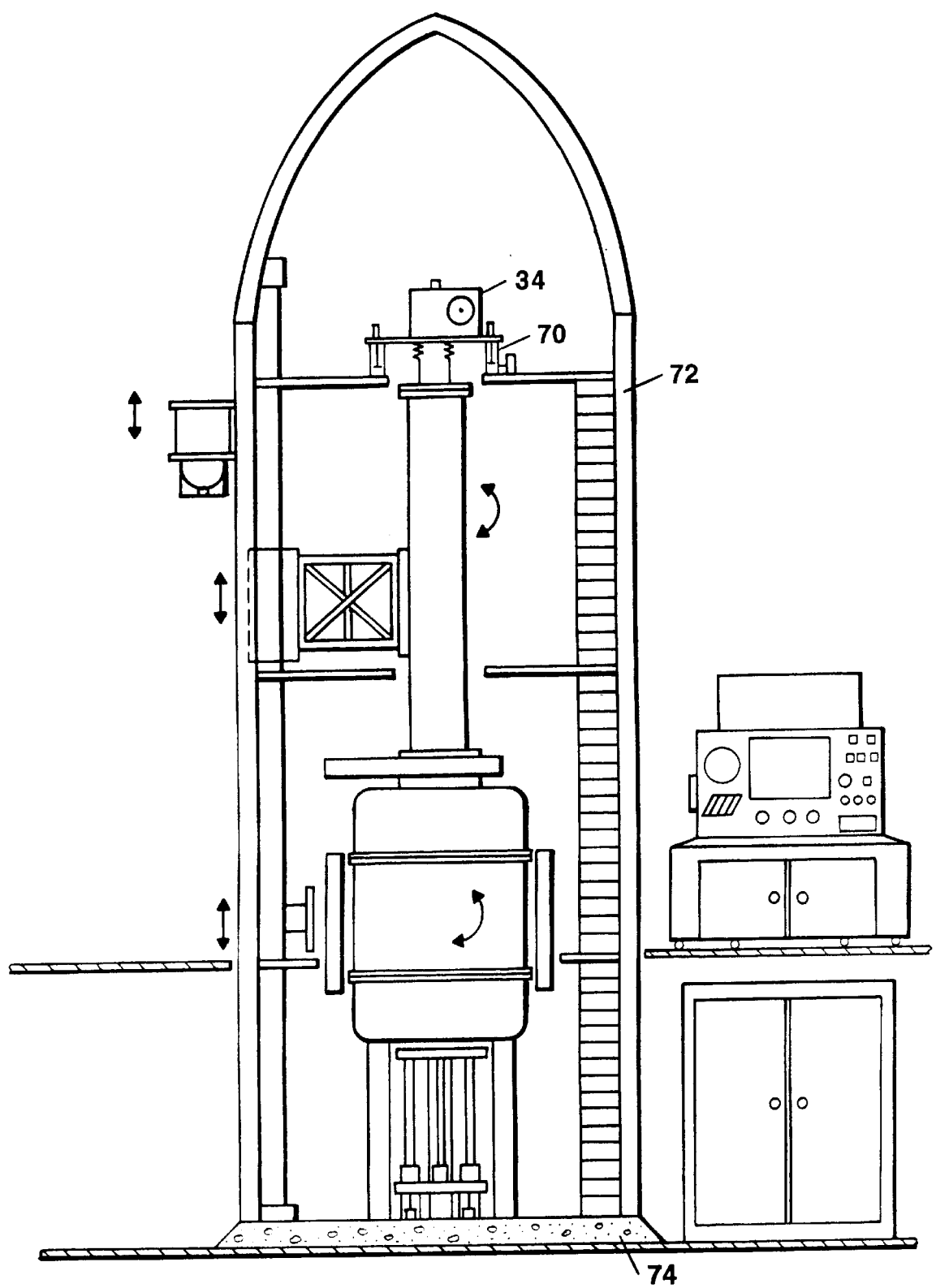
FIG. 5 is a side view of an alternative crystal puller design using the invention.

The above embodiments are exemplary and skilled artisans will appreciate that the inventive concept of aligning a pull head independently of the receiving chamber is applicable to other structures. For example, the XYZ table 60 of FIGS. 3 and 4 may be replaced with an XY table may be used with vertical adjustment accomplished using leveling screws provided on vibration dampers 64. Analogously, other crystal pullers assemblies may advantageously use the invention. For example, the crystal puller of FIG. 5 similarly uses an alignment mechanism 70 for the pull head 34 which is attached to the rigid support 72, while being connected directly to the ground 74.

While the invention has been shown and described above with respect to various preferred embodiments, it will apparent that the foregoing and other changes of the form and detail may be made therein by one skilled in the art without departing from the spirit and scope of the invention.

What is claimed is:

1. A method for aligning a pull head in a crystal growing system having a pull head, a multi-section vacuum chamber including a receiving chamber, and a crucible located in the vacuum chamber and supported on a surface, the method comprising the steps of:
   (a) providing a rigid support frame supported on the surface;
   (b) mounting the pull head on the support frame independent of a position of the vacuum chamber; and
   (c) aligning the pull head relative to the crucible.

2. The method of claim 1 wherein step (b) comprises the further step of:
   (b1) attaching the pull head to the support frame with a mounting mechanism that comprises a releasable connection between the pull head and the mounting mechanism which allows the pull head to be attached to the support frame while maintaining alignment relative to the crucible.

3. The method of claim 2 wherein step (b1) comprises the step of:
   (b1a) attaching the pull head to the vacuum chamber when the pull head is detached from the support frame.

4. The method of claim 1 wherein step (b) further comprises the steps of:
   (b2) connecting the adjustment apparatus between the mounting mechanism and the support frame; and
   (b3) connecting the adjustment apparatus between the mounting mechanism and the support frame.

5. The method of claim 1 wherein step (c) further comprises the step of:
   (c1) adjusting the position of the pull head relative to the support frame in three dimensions.

6. The method of claim 1 wherein step (c) comprises the step of:
   (c2) damping vibrations through the mounting mechanism.

7. The method of claim 1 wherein step (c) comprises the step of:
   (c3) adjusting the pull head relative to the crucible so that the pull head rotational axis is colinear with the crucible rotational axis.

8. The method of claim 1 wherein step (c) comprises the step of:
   (c4) adjusting the pull head so that the pull head rotational axis is vertical.

9. A method for aligning a pull head in a Czochralski crystal growing system having a pull head, means for rotating the pull head about an axis, a multi-section vacuum chamber including a receiving chamber, a crucible located in the vacuum chamber and a crucible support system for supporting the crucible on a surface and for rotating the crucible about an axis, the comprising the steps of:
   (a) supporting a rigid support frame on the surface and independent of the vacuum chamber;
   (b) mounting the pull head on the support frame with a mounting mechanism for removably mounting the pull head; and
   (c) aligning the pull head rotation axis relative to the crucible rotation axis Independently of a position of said receiving chamber with an adjustment apparatus connected between the mounting mechanism and the support frame.

10. The method of claim 9 comprising the step of:
    (d) reattaching the pull head to the support frame and realigning the pull head through use of a mounting mechanism that comprises a self-aligning connection between the pull head and the mounting mechanism which allows the pull head to be detached from the support frame.

11. The method of claim 10 wherein step (b) includes the step of:
    (b1) mounting the pull head through a pull head plate to support structures connected to the adjustment apparatus, the pull head plate being connected to the pull head and having locating holes passing therethrough and the support structures including locating pins which engage the locating holes when the pull head is mounted.

12. The method of claim 11 wherein step (b) includes the step of:
    (b2) damping vibrations through use of support structures which include vibration dampers.

13. The method of claim 9 wherein step (b) includes the step of:
    (b3) aligning the pull head using an XYZ adjustable table.

14. A method of aligning a pull head pull head for use in a Czochralski crystal growing system having a pull head, means for rotating the pull head about an axis, a multi-section vacuum chamber including a receiving chamber for receiving a growing crystal, a crucible located in the vacuum chamber and a crucible support system for supporting the crucible on a surface and for rotating the crucible about an axis, comprising the steps of:

(a) supporting a rigid support frame on the surface independent of the vacuum chamber;

(b) aligning the pull head rotation axis relative to the crucible rotation axis, independently of a position of said receiving chamber with an XYZ table mounted on the support frame;

(c) connecting a pull head plate having locating holes passing therethrough to the pull head;

(d) a plurality of support structures connected to the XYZ table; and (e) engaging a locating pin mounted on each of the plurality of support structures with the locating holes to support the pull head on the support frame.

15. The method of aligning a pull head of claim 14 comprising the further steps of:

(f) coupling the pull head plate to the receiving chamber via a compressible bellows, wherein the pull head plate comprises receiving chamber-positioning holes and the receiving chamber comprises a receiving chamber-positioning pin;

(g) engaging the receiving chamber-positioning holes with the receiving chamber positioning pin when the bellows is in a compressed state; and (h) disengaging the chamber-positioning holes when the bellows is an expanded state.

16. The method of aligning a pull head of claim 15 comprising the further steps of:

(i) attaching the receiving chamber to a movable lift;

(j) controlling the lift to move the receiving chamber to cause the chamber-positioning holes to disengage the chamber-positioning pins and to cause the locating pins to engage the locating holes.

17. The method of aligning a pull head of claim 14 comprising the further step of:

(k) damping vibrations with the support structures, which comprise vibration dampers.

* * * * *

UNITED STATES PATENT AND TRADEMARK OFFICE
CERTIFICATE OF CORRECTION

PATENT NO. : 6,042,645
DATED : March 28, 2000
INVENTOR(S) : Zhixin Li

Page 1 of 1

It is certified that error appears in the above-identified patent and that said Letters Patent is hereby corrected as shown below:

<u>Title page,</u>
Line 60, change "Jan. 25, 1976" to -- Jan. 25, 1996 --

Signed and Sealed this

Twenty-third Day of April, 2002

Attest:

JAMES E. ROGAN
Attesting Officer     Director of the United States Patent and Trademark Office